United States Patent [19]

Angelucci et al.

[11] Patent Number: 4,912,402
[45] Date of Patent: Mar. 27, 1990

[54] FIXTURE FOR MEASURING THE STATIC CHARACTERISTICS OF MICROWAVE THREE-TERMINAL ACTIVE COMPONENTS

[75] Inventors: Angelo Angelucci, Nole Canavese; Roberto Burocco, Vercelli; Gianni Clerico Titinet, Coggiola, all of Italy

[73] Assignee: Cselt-Centro Studi E Laboratori Telecomunicazioni S.p.A., Torino, Italy

[21] Appl. No.: 316,409

[22] Filed: Feb. 27, 1989

[30] Foreign Application Priority Data

Mar. 23, 1988 [IT] Italy ................................ 67258-A/88

[51] Int. Cl.$^4$ ........................... G01R 1/02; G01R 1/04
[52] U.S. Cl. .............................. 324/158 F; 324/158 T; 333/238; 333/246
[58] Field of Search ............... 324/158 F, 158 P, 72.5, 324/158 T; 333/33, 258, 246

[56] References Cited

U.S. PATENT DOCUMENTS

| 4,340,873 | 7/1982 | Bastida | 333/246 |
| 4,535,307 | 8/1985 | Jsukii | 324/158 F |
| 4,538,124 | 8/1985 | Morrison | 333/246 |
| 4,733,209 | 3/1988 | Paynting | 333/246 |
| 4,764,723 | 8/1988 | Staid | 333/246 |
| 4,808,919 | 2/1989 | Sylviane et al. | 333/246 |
| 4,823,097 | 4/1989 | Konishi et al. | 333/238 |

Primary Examiner—Reinhard J. Eisenzopf
Assistant Examiner—W. Burns
Attorney, Agent, or Firm—Herbert Dubno

[57] ABSTRACT

A fixture for measuring the static characteristics of microwave active components has mechanical devices for supporting two dielectric substrates. Two terminals of the components under test are separately connected to electrical circuits constructed on said dielectric substrates. This fixture can be adapted to geometric sizes of component case and allows it to be submitted to thermal tests, without mechanical stresses due to expansion. The electrical circuits constructed on the dielectric substrates ensure circuit stability avoiding spurious oscillations during static characteristic measurement.

8 Claims, 3 Drawing Sheets

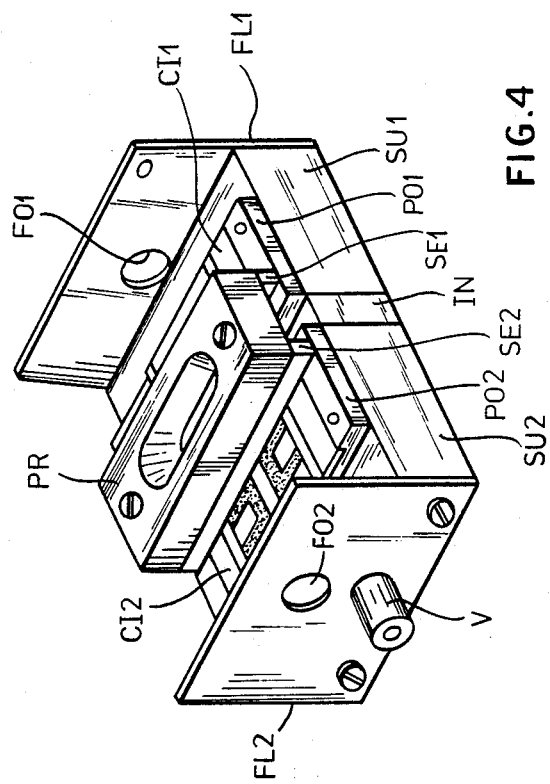

FIXTURE FOR MEASURING THE STATIC CHARACTERISTICS OF MICROWAVE THREE-TERMINAL ACTIVE COMPONENTS

FIELD OF THE INVENTION

Our present invention relates to measurements of the electrical characteristics of three-terminal active-components for microwave circuits and, more particularly, to a fixture for measuring such static characteristics.

BACKGROUND OF THE INVENTION

Measurable components can be gallium arsenide (GaAs) or silicon (Si), FET or bipolar transistors, for small or large signals, encapsulated in cases or as chips, etc.

The measurements can obtain output, input or mutual characteristic curves (drain current $I_D$ versus drain voltage $V_D$ for different gate voltages $V_G$, gate current $I_G$ versus gate voltage $V_G$ or drain current $I_D$ versus gate voltage $V_G$ for different drain voltages $V_D$ in case of FETs), all under static conditions, i.e. under current test conditions.

These types of measurement prove useful both to determine the electrical behavior of the component, and to predict its reliability. In fact they allow bias current and voltage measurements for a particular quiescent operating point and their possible variations under extreme thermal conditions.

Making these measurements in practice, however, presents some difficulties, chiefly due to the rise of spurious oscillations in the component under test. The spurious oscillations not only alter the voltage and current values, but also can cause destruction of the components.

These spurious oscillations occur principally when a high current flows through the component, since in these conditions the transconductivity value increases and hence the gain of the whole measuring circuit increases as well. Low intrinsic capacitances of the component and those between the terminals and connections to bias networks are sufficient to cause a positive reaction to a determined frequency.

It is to be added that these components, meant to operate in the microwave domain, have very high cut-off frequencies (even 30 GHz) and hence extremely high gains at very low frequencies, at which spurious oscillations can take place easily.

The measurement circuit must then be stabilized over a wide frequency range, practically starting from dc current, so as to obtain reliable measured values and avoid the risk of destroying the component. In case of FET, the destruction is generally due to the failure of the gate junction, namely a Schottky type junction, directly biased when wide amplitude oscillations are present.

Different methods are presently used in laboratories to avoid spurious oscillations in the test circuit and hence to overcome the disadvantages above. A first method uses series resonant circuits and RC circuits, placed in parallel with the output circuit, which operate as loads at the spurious oscillation frequency. This method, however, is not of immediate use, since these circuits have a frequency-selective behavior. In addition, since they are implemented with lumped elements, the previous knowledge of the frequency of the spurious oscillation is required in order to obtain the tuning of the above circuits for each type of active component.

Another method consists of inserting a stabilizing resistance in series with the input circuit, connecting it as close as possible to the component itself in order to reduce as much as possible reactive parasitic parameters. This resistance reduces the stage gain over a very wide frequency band, avoiding spurious oscillations. Yet it allows neither direct voltage measurement at the input port, nor current measurement through the output port when a considerable current amount flows through the input port. In fact, in this case voltage drop across the stabilizing resistance is considerable. Consequently, the voltage measured at the output terminal and the corresponding output current are considerable.

In a further method, the test component is surrounded by electromagnetic wave absorbent materials, such as certain graphite-loaded spongy materials. It is clear that in this case, encumbrance is considerable, especially if the number of test fixtures is high, the effectiveness is poor especially at the lowest frequencies, where the active component is more unstable

OBJECTS OF THE INVENTION

It is the principal object of this invention to provide an improved test fixture for three-terminal active microwave components whereby the drawbacks enumerated above are eliminated.

Another object is to provide an improved test fixture for the latter purpose whereby thermally induced problems do not arise.

SUMMARY OF THE INVENTION

The disadvantage of earlier systems are overcome by the fixture for measuring the static characteristics of microwave active components, provided by the present invention, which allows contemporaneous measurement of currents and voltages at input and output ports up to the maximum permitted values, without any danger of spurious oscillations, with reverse and direct bias. It does not use narrow-band components and hence its effectiveness extends from dc current to the maximum operation frequency of the component without needing any tuning. It has reduced size and is easy to make.

The present invention provides a fixture for measuring the static characteristics of microwave three-terminal active components comprises a supporting mechanical device for supporting two dielectric substrates carrying the electrical circuits connected separately to input and output terminals of the component under test.

The device comprises:

two metallic supporting blocks which are respectively screwed to two flanges provided with holes for housing two electrical connectors with noise-suppressing filters for the application of bias voltages to the component;

a metallic intermediate block allowing the two supporting blocks to be connected and an intermediate groove to be obtained for housing with accuracy the component fastened by screws, two holes allowing a pressing element to be fastened, this intermediate block having also the task of ensuring the electrical contact to the common terminal of the component and the thermal contact to the whole component;

two small plugs to align the two supporting blocks and the intermediate block when they are blocked by a screw, passing through a supporting block and through the intermediate block and screwed into a threaded hole of the other supporting block;

two plates screwed to the supporting blocks, support the dielectric substrates and adapt the thermal expansions of supporting blocks to the expansions of dielectric substrates;

a pressing element, equipped with two insulating bars, adapted to press the component input and output terminals onto dielectric substrates to ensure their electrical connection without soldering;

two dielectric substrates, each of which carries on one side a ground conductive plane and on the other the following lines:

a. a median line, made of conductive material and equipped at one end with a pad for the connection to the power-supply connector;

b. two resistive lines adjacent to the median line to which they are electrically connected along the edges, and supplied with resistive branches placed perpendicularly; and c. two conductive lines placed in symmetrical position with respect to the median line and parallel to it and in connection with the ends of the perpendicular branches of the resistive lines.

BRIEF DESCRIPTION OF THE DRAWING

The above objects, features and advantages of our invention will become more readily apparent from the following description, reference being made to the accompanying drawing in which:

FIG. 4 shows the assembled fixture in a perspective view.

SPECIFIC DESCRIPTION

In the following example, the active component under measurement or test is assumed to be microwave FET, having gate, source and drain terminals.

Figure 1:
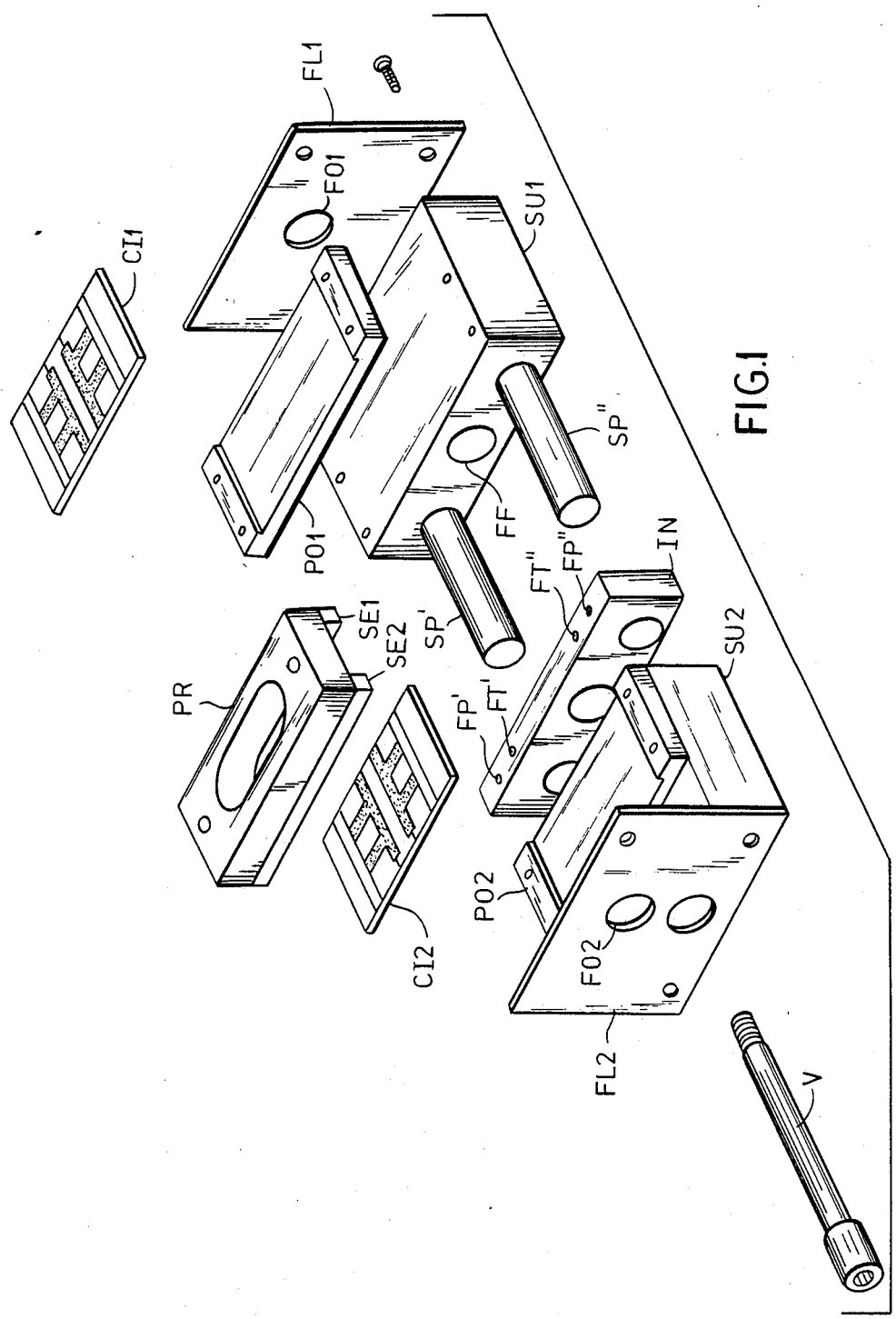
FIG. 1 is an exploded view of the supporting mechanical part.

The supporting mechanical part, shown in FIG. 1, supports two dielectric substrates whereupon electrical circuits are constructed and separately connected to the gate and drain of the FET under test. It can be adapted to the geometrical sizes of the component case and allows the FET to be submitted to thermal tests avoiding stresses which are too great due to expansion.

It has two metallic supporting blocks SU1 and SU2, which are respectively screwed to two flanges FL1 and FL2, provided with holes FO1 and FO2 for housing two electrical connectors with noise-suppressing filters for the application of bias voltages to the FET.

A metallic intermediate block IN allows the two supporting blocks to be connected and an intermediate groove to be obtained for housing with accuracy the FET case.

This and the intermediate block has its width and height suited to match the dimensions of the case of the FET under test. Namely, the width will be more or less equal to the case width and the height will be such as to allow FET terminals to easily rely on the electrical circuit lines. The FET can be fixed on the intermediate block by screws screwed into holes FT' and FT", while holes FP' and FP" allow a pressing element PR, described hereinafter, to be fastened. This intermediate block is also designed to guarantee the electrical contact to FET source and the thermal contact to the entire component.

Two small plugs Sp' and SP" are provided to align the two supporting blocks and the intermediate block when they are drawn together by screw V, passing through SU2 and IN and screwed into threaded hole FF of SU1.

Two plates PO1 and PO2, screwed to supporting blocks SU1 and SU2 support the already mentioned dielectric substrates CI1 and CI2.

The dielectric substrates CI1 and CI2 are fastened by adhesive conducting the electrical current to ensure an effective ground. Plates PO1 and PO2 are meant to adapt thermal expansions of supporting blocks SU1 and SU2 to thermal expansions of dielectric substrates CI1 and CI2, in order to avoid excessive mechanical stresses during heating cycles occurring while measuring the FET under test.

The material of the plates PO1 and PO2 must then have a thermal expansion coefficient which is intermediate between that of the plates and that of the dielectric substrates. For example, if the supporting blocks are made of brass and the substrates of alumina, PO1 and PO2 can be made of brass and the substrates of alumina, PO1 and PO2 can be made of an iron-nickel-cobalt alloy, e.g. so-called kovar.

The already-mentioned pressing element PR is made of the same material as plates PO1 and PO2 and supplied with two insulating bars SE1 and SE2, adapted to press FET gate and drain terminals onto substrates CI1 and CI2 to ensure their electrical contact without soldering.

In case the component is available as a "chip" or "chip on carrier", the terminals are lacking. That is why the connection to the lines of the substrate CI1 and CI2 is effected by the "wire-bonding" technique. Of course, in this case, pressing element PR is no longer required.

Figure 2:
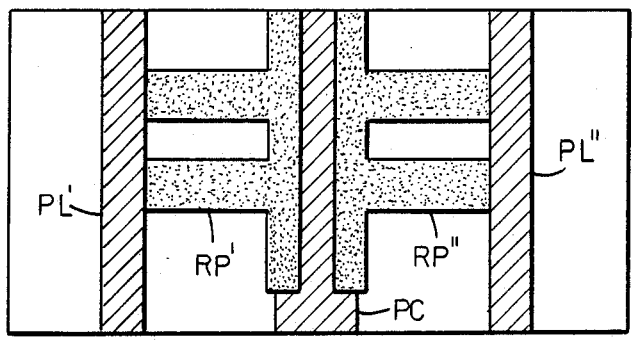
FIG. 2 shows one of the two dielectric substrates whereupon the electrical circuit is constructed.

The electrical circuit constructed on each of substrates CI1 and CI2 can be seen in FIG. 2. On the dielectric substrate which is made of quartz, alumina, beryllium oxide or the like, there is deposited on one side a ground conductive plane and on the other, some conductive material, e.g. of gold and is equipped on one end with a pad far the connection to the power-supply connector. On the other end, the gate or drain of the FET under test is placed in contact with the line PC.

Two resistive lines RP' and RP", each equipped with two branches perpendicularly arranged, are placed in contact with both edges of line PC. These lines can be made of suitable resistive substances, e.g. TaN or others. In symmetrical position with respect to line PC and parallel to it, there are two more conductive lines PL' and PL". The latter lines are also in contact with the ends of the branches perpendicular to the resistive lines RP' and RP". Lines PL' and PL" are in turn connected to capacitor terminals (not shown in the drawing which are grounded through plates PO1 and PO2 (FIG. 1). The lateral ends of resistive lines RP' and RP" are thus grounded in ac application and insulated in dc current. This circuit can be constructed in the thin film technique.

Figure 3:
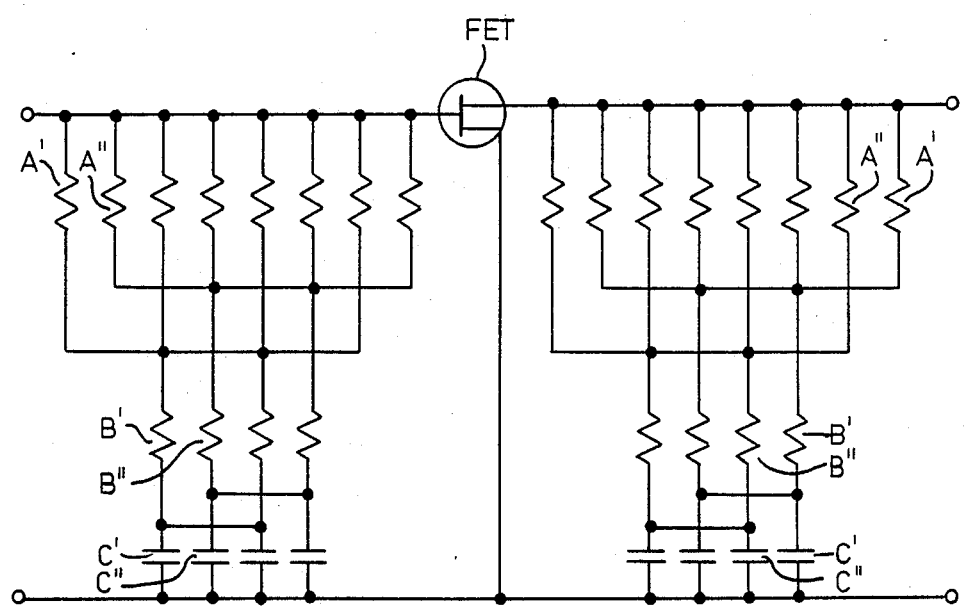
FIG. 3 is an equivalent electrical diagram of the measurement circuit.

With reference to the equivalent electrical circuit shown in FIG. 3 for the circuits, the resistive lines parallel to the conductive lines are equivalent to sets of resistance A' and B". In addition, there are sets of grounded capacitors C' and C". Each set of capacitors consist of at least a high capacitance capacitor and one of low capacity, so as to reduce parasitic reactance both at low and high frequencies. The equivalent high-frequency resistance seen from FET gate or drain towards the ground can thus be conveniently set to about 50 ohm. This value has been obtained by two resistive parallel branches, but it could also be obtained by three or more branched of smaller width.

This combination of conductive and resistive lines allows high stability of the measuring circuit to be obtained by damping possible oscillations. In fact, a possible wave generated by the transistor is progressively attenuated along resistive lines and reflected wave formation is prevented since there are no significant discontinuity points. These points would certainly be formed if lumped resistances were connected to FET gate and drain. Such resistances, therefore, could not ensure circuit stability.

To evaluated the impedance matching between conductive lines and drain and gate terminals of the transistor under test, measurements are made over a wide range of frequencies. More particularly, the reflection coefficient seen by transistor terminal in the most disadvantageous condition has been measured, i.e. the condition in which the connector with noise-suppressing filter does not result connected to the power-supply source; such a coefficient has resulted inferior to 0.1 ($-20$ dB) in the range within 3 and 26 CHz. As known, reflection coefficients causing transistor instability present values in modulus which are generally much higher than the above-mentioned value.

We claim:

1. A fixture for measuring static characteristics of a microwave three-element device, comprising:
   two metal supporting blocks;
   respective flanges secured to said supporting blocks and formed with respective holes for receiving respective electrical connectors with noise-suppressing filters for the application of bias voltages to a microwave three-element device to be tested;
   a metal intermediate block between said supporting block, said blocks being provided with means for assembling said blocks with said supporting blocks flanking said intermediate block and defining with said intermediate block a groove for receiving said device, said intermediate block forming an electrical contact for said device and contacting same to provide thermal therewith;
   alignment plugs on at least one of said blocks and engageable in others of said blocks for aligning said blocks, aid means for assembling including at least one screw threaded into one of the supporting blocks and braced against the other supporting blocks for holding said blocks together;
   respective plates connected to said supporting blocks for adapting to thermal expansion;
   respective test circuits having dielectric substrates mounted on said plates and connected electrically separately to input and output terminals of said device, whereby said plates adapt said supporting blocks to thermal expansion characteristics of said substrates; and
   a pressing element formed with two insulating bars adapted to press input and output terminals of said device onto said test circuits to ensure solderless electrical connection of said terminals with said circuits,
   each of said test circuits comprising:
   a ground conductive plane formed on one side of the respective dielectric substrate,
   a median conductive line formed in the other side of the respective substrate and provided at one end with a pad for connection to a power-supply connector,
   two resistive lines on said other side of the respective substrate adjacent the median line and electrically connected thereto along edges and formed with resistive branches extending perpendicularly to said resistive lines, and
   two conductive lines disposed symmetrically with respect to the median line, parallel to said median line and connected to ends of said branches from a respective ones of said resistive lines.

2. The fixture defined in claim 1 wherein said circuits include capacitors and the symmetrically disposed conductive lines are connected to terminals of said capacitors and said capacitors are grounded through the respective ones of said plates.

3. The fixture defined in claim 1 wherein said plates are made of a material with a thermal expansion coefficient intermediate that of the supporting plates and that of the dielectric substrates.

4. The fixture defined in claim 1 wherein said intermediate block has a width nearly equal to that of a case of the device and a height allowing easy connection of the input and output terminals of said device to the median lines of the circuits.

5. The fixture defined in claim 4 wherein said plates are made of a material with a thermal expansion coefficient intermediate that of the supporting plates and that of the dielectric substrates.

6. The fixture defined in claim 5 wherein said circuits include capacitors and the symmetrically disposed conductive lines are connected to terminals of said capacitors and said capacitors are grounded through the respective ones of said plates.

7. The fixture defined in claim 6 wherein said substrates are received in respective recesses formed in said plates.

8. The fixture defined in claim 7 wherein said plugs are formed on said one of said supporting blocks and pass through said intermediate block into said other of said supporting blocks.

* * * * *